(12) United States Patent
Kono

(10) Patent No.: US 6,714,471 B2
(45) Date of Patent: Mar. 30, 2004

(54) SEMICONDUCTOR MEMORY DEVICE HAVING PREAMPLIFIER WITH IMPROVED DATA PROPAGATION SPEED

(75) Inventor: Takashi Kono, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/270,653

(22) Filed: Oct. 16, 2002

(65) Prior Publication Data

US 2003/0198097 A1 Oct. 23, 2003

(30) Foreign Application Priority Data

Apr. 11, 2002 (JP) ........................................ 2002-109487

(51) Int. Cl.[7] ................................................ G11C 7/00
(52) U.S. Cl. .................. 365/205; 365/189.05; 365/208; 365/233
(58) Field of Search ................................ 365/205, 207, 365/208, 233, 189.05, 194

(56) References Cited

U.S. PATENT DOCUMENTS 6,002,615 A * 12/1999 Sawada ................. 365/189.01
6,279,073 B1 * 8/2001 McCracken et al. ........ 711/105
6,407,962 B1 * 6/2002 Ka .............................. 365/233
6,512,719 B2 * 1/2003 Fujisawa et al. ............ 365/233
2002/0141280 A1 * 10/2002 Hamamoto et al. ......... 365/233

FOREIGN PATENT DOCUMENTS

JP            9-297991         11/1997      ......... G11C/11/407

* cited by examiner

Primary Examiner—Son Mai
(74) Attorney, Agent, or Firm—McDermott, Will & Emery

(57) ABSTRACT

A preamplifier includes an amplifier circuit amplifying a signal level of read data, a latency shifter outputting the read data onto a data line pair in response to an internal signal determining a timing of outputting the read data onto the data bus pair, and a driver outputting the read data onto the data bus pair. The amplifier circuit receives the internal signal and outputs the read data onto the data line pair while bypassing the latency shifter when the internal signal is already at high level at the timing when the signal level of the read data is amplified. As a result, a semiconductor memory device can speed up propagation of the read data from the preamplifier onto the data bus pair in a high frequency operation.

7 Claims, 12 Drawing Sheets

F I G. 1
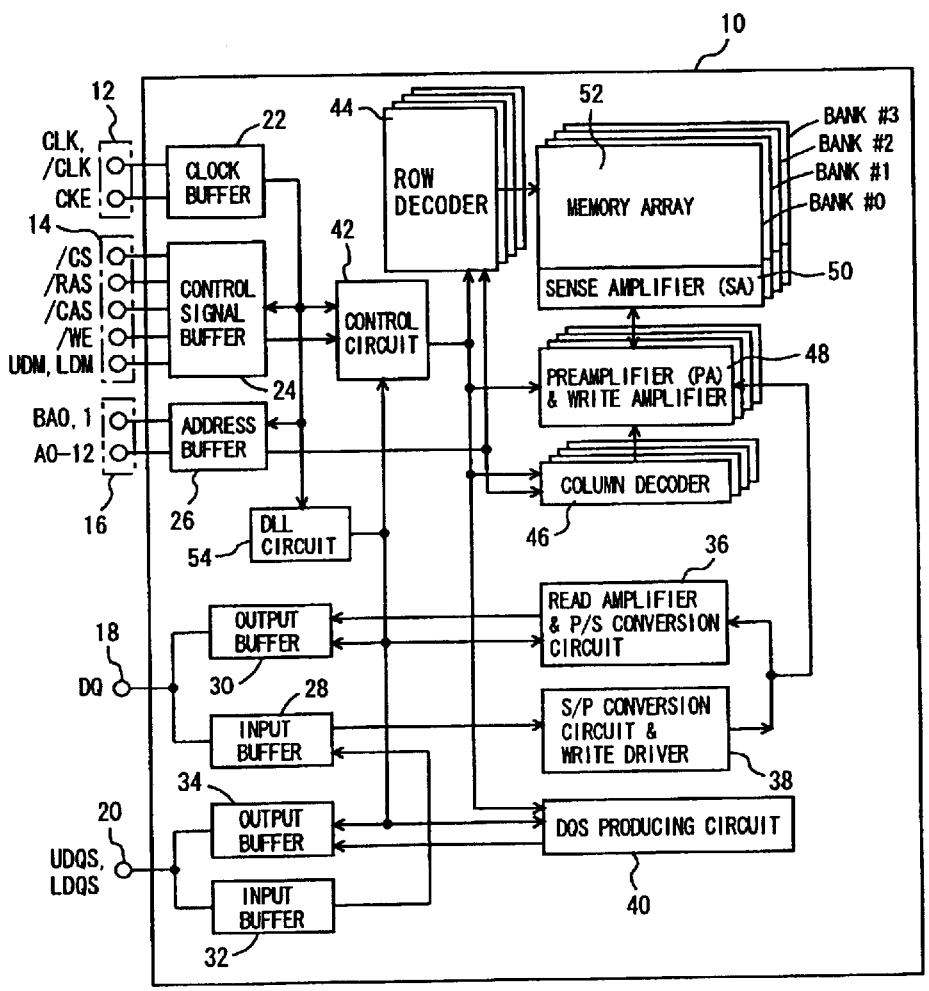

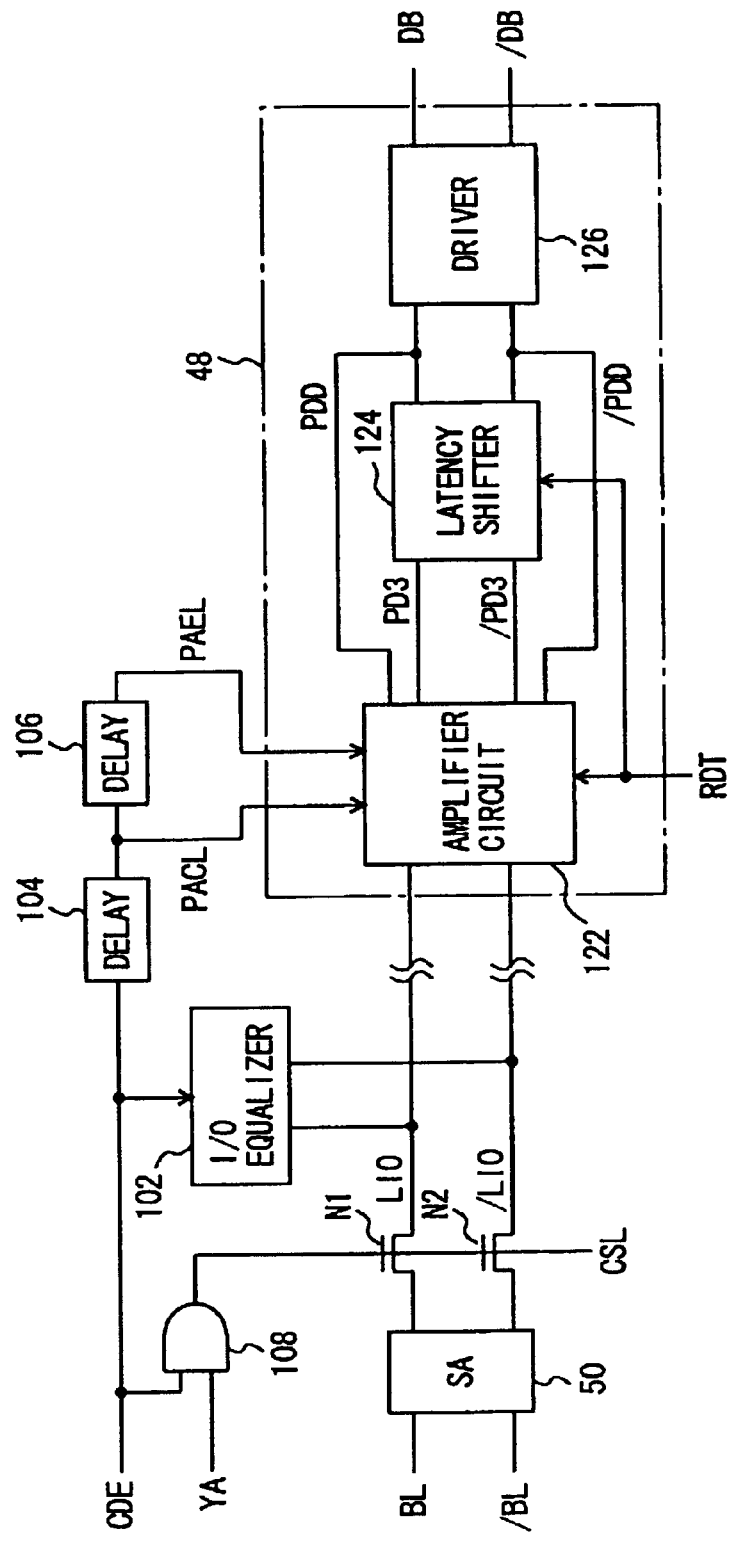
F I G. 2

SEMICONDUCTOR MEMORY DEVICE HAVING PREAMPLIFIER WITH IMPROVED DATA PROPAGATION SPEED

BACKGROUND OF THE INVENTION

1. Field of the Invention

The present invention relates to a semiconductor memory device, and more particularly to a semiconductor memory device operating at high frequencies in synchronization with a rise and a fall of an external clock and including a preamplifier amplifying data read from a memory cell array to be output to a data bus pair.

2. Description of the Background Art

By demand for a higher frequency operation of a semiconductor device, a DDR SDRAM (Double Data Rate Synchronous Dynamic Random Access Memory) allowing data input/output in synchronization with a rising edge and a falling edge of an external clock has been developed and brought into practical use.

FIG. 10 is a timing chart showing a data output timing in reading data from a DDR SDRAM that is a so-called DDR-I. In this DDR SDRAM, a CAS latency CL is set at 2.0 and a burst length BL is set at four. Here, CAS latency represents the number of cycles (one cycle corresponds to the rise of an external clock CLK to the next rise) required for DDR SDRAM to receive an READ command (a command for reading data) from the outside and then to start to output the read data to the outside. Furthermore, the burst length represents the number of bits successively read in response to READ command.

Referring to FIG. 10, DDR-I outputs data DQ that is the read data and a data strobe signal DQS in synchronization with external clocks CLK, /CLK. Here, external clock /CLK is a clock signal complimentary to external clock CLK. Data strobe signal DQS is a signal for use as a take-in timing of data DQ at an external controller receiving data DQ.

A timing difference tAC between the edges of external clocks CLK, /CLK and the output of data DQ is defined to fall within a certain range. In FIG. 10, timing difference tAC is controlled at zero.

In order to realize a data output as shown in FIG. 10, there is need for an operation clock of which timing is slightly earlier than the timing of the edges of external clocks CLK, /CLK at a data output circuit. This is because a delay occurs from an input of the external clock to the semiconductor memory device to an actual output of data due to the capacity of each circuit which is included in the device.

More specifically, what is required is a clock generation circuit operated in a manner as follows. As external clocks CLK, /CLK are fixed-cycle signals, internal clocks CLK_P, CLK_N shifted backward by an appropriate time Ta with respect to the edges of external clocks CLK, /CLK are generated by delaying external clocks CLK, /CLK by an appropriate delay amount Td. Furthermore, the delay amount Td can be controlled such that data DQ output from the data output circuit operating using these internal clocks CLK_P, CLK_N as a trigger and data strobe signal DQS output from a data strobe signal output circuit satisfy the aforementioned timing difference tAC. A circuit generating such an internal clock is called a DLL (Delay Locked Loop) circuit.

Now, in order to carry out the data output as shown in FIG. 10, a so-called pipeline operation is necessary in which data read from the memory cell array is appropriately shifted in synchronization with internal clocks CLK_P, CLK_N and is finally delivered to an output buffer. More specifically, the data read from the memory cell array sequentially passes through each stage forming a pipeline at an appropriate timing synchronized with internal clocks CLK_P, CLK_N and reaches the output buffer. Although a variety of configurations may be employed as a stage configuration of the pipeline, a first stage may correspond to a segment up until the read data is output to a data bus pair DB and /DB after a preamplifier.

FIG. 11 is a functional block diagram functionally illustrating the circuit configuration from a bit line pair BL and /BL to data bus pair DB and /DB in a case where the segment described above is a first stage of the pipeline.

Referring to FIG. 11, a sense amplifier 50 detects and amplifies data read from the memory cell array (not shown) onto bit line pair BL and /BL. Thereafter, a decode signal YA corresponding to an externally received column address goes to H (logic high) level. After an appropriate delay time period, a column decode enable signal CDE for activating a column select line CSL goes to H level. Accordingly, the output of an AND gate 108 goes to H level and one column select line CSL corresponding to the column address is selected. Then data is output at small amplitude from sense amplifier 50 through N-channel MOS transistors N1, N2 onto an I/O line pair LIO and /LIO. It is noted that an I/O equalizer 102 is a circuit equalizing I/O line pair LIO and /LIO at H level in advance before data is output onto I/O line pair LIO and /LIO. Then, the data on I/O line pair LIO and /LIO is input to a preamplifier 148.

Preamplifier 148 includes an amplifier circuit 222, a latency shifter 124 and a driver 126. Here, latency shifter 124 configures a data shift circuit.

Amplifier circuit 222 resets the internal state based on a signal PACL output from a delay circuit 104 and amplifies a small amplitude signal on I/O line pair LIO and /LIO by a differential amplifier included therein based on a signal PAEL output from a delay circuit 106. Amplifier circuit 222 then outputs the amplified signal onto data line pair PD3 and /PD3.

Latency shifter 124 holds data received from data line pair PD3 and /PD3 until a signal RDT goes to H level, and outputs the data onto data line pair PDD and /PDD at a timing when signal RDT goes to H level. Driver 126 outputs data received from data line pair PDD and /PDD onto data bus pair DB and /DB at small amplitude.

Here, signal RDT received by latency shifter 124 is a signal that determines the timing at which data is moved from a first stage to a second stage in the pipeline operation, and determines the timing at which the data amplified by amplifier circuit 222 is output onto data bus pair DB and /DB. Signal RDT is generated by a control circuit (not shown), starting from a clock cycle following a clock cycle that is a starting point of reading corresponding data from the memory cell array.

Delay circuit 104 receives column decode enable signal CDE and outputs signal PACL produced by delaying column decode enable signal CDE by an appropriate amount to delay circuit 106 and to amplifier circuit 222 in preamplifier 148. This signal PACL provides a timing for resetting the internal state in preamplifier 148. Delay circuit 106 receives signal PACL output from delay circuit 104 and outputs signal PAEL produced by delaying signal PACL by an appropriate amount to amplifier circuit 222. This signal PAEL provides a timing for amplifying the signal received from I/O line pair LIO and /LIO in amplifier circuit 222 in preamplifier 148 for output to latency shifter 124.

FIGS. 12–16 are circuit diagrams showing a circuit configuration of amplifier circuit 222. Amplifier circuit 222 includes an input processing circuit 132, a PAE generation circuit 234, a CLRES generation circuit 136, a /PAEC generation circuit 138 and an amplify/output circuit 240.

Referring to FIG. 12, input processing circuit 132 includes an inverter 1322, an NAND gate 1324 and an NOR gate 1326. A signal /PAEQ generated in response to signal PACL output from delay circuit 104 is a signal for equalizing differential amp nodes PAN, /PAN in amplify/output circuit 240 described later. Signal PADT generated in response to signal PAEL output from delay circuit 106 is a signal being at H level from H level of signal PACL to H level of signal PAEL, for connecting differential amp nodes PAN and /PAN to I/O line pair LIO and /LIO to take in data on I/O line pair LIO and /LIO into preamplifier 148, in amplify/output circuit 240 described later.

Referring to FIG. 13, PAE generation circuit 234 includes inverters 2342–2346. Signals PAE, /PAE generated in response to signal PAEL are signals for activating a differential amplifier included in amplify/output circuit 240 described later.

Referring to FIG. 14, CLRES generation circuit 136 includes an NOR gate 1362 and an inverter 1364. Here, a signal /ACT is received from the control circuit (not shown) and goes to L (logic low) level when rows are activated. A signal CLRES generated in response to signal PACL is a signal for resetting a latch circuit on a stage following the differential amplifier included in amplify/output circuit 240 described later.

Referring to FIG. 15, /PAEC generation circuit 138 includes an NOR gate 1382. A signal /PAEC is a signal for activating the latch circuit on the stage following the differential amplifier included in amplify/output circuit 240 described later.

Referring to FIG. 16, amplify/output circuit 240 includes an input circuit 1402, an equalizer circuit 1404, a differential amplifier 1406, inverters 1408–1414 and latch circuits 1416, 1418.

Input circuit 1402 includes an inverter 1422 and P-channel MOS transistors P1 and P2. Input circuit 1402 connects I/O line pair LIO and /LIO respectively to differential amp nodes PAN and /PAN to transmit data on I/O line pair LIO and /LIO to differential amp nodes PAN and /PAN, when signal PADT goes to H level.

Equalizer circuit 1404 includes P-channel MOS transistors P3 and P4. Equalizer circuit 1404 equalizes differential amp nodes PAN and /PAN to H level when signal /PAEQ is at L level.

Differential amplifier 1406 includes P-channel MOS transistors P5–P7 and N-channel MOS transistors N3–N5. Differential amplifier 1406 is activated by signals PAE and /PAE and amplifies small amplitude signals on differential amp nodes PAN, /PAN transmitted from I/O line pair LIO and /LIO through input circuit 1402 to provide signals fully swinging between a power supply voltage and a ground voltage.

Inverter 1408 includes P-channel MOS transistors P8 and P9 and an N-channel MOS transistor N6. Inverter 1408 is activated along with differential amplifier 1406 when signal /PAE is at L level, and inverts and outputs the signal on differential amp node PAN to a node ND3.

Inverter 1410 includes P-channel MOS transistors P10 and P11 and an N-channel MOS transistor N7. Inverter 1410 is activated when signal /PAEC is at L level, and inverts and outputs the signal on node ND3 to a node ND4.

Latch circuit 1416 includes inverters 1424 and 1426. Latch circuit 1416 latches the signal on data line PD3 for a period during which signal /PAEC generated by /PAEC generation circuit 138 is at H level after differential amplifier 1406 amplifies the signals on differential amp nodes PAN and /PAN and is then inactivated (signal PAE goes to L level), that is, until signal PACL goes to H level in order to read the next read data.

Then, when signal PACL goes to H level, signal CLRES output from CLRES generation circuit 136 goes to H level and signal /PAEC output from /PAEC generation circuit 138 goes to L level (at this point, signal PAE is at L level until signal PAEL goes to H level), so that latch circuit 1416 resets data line PD3 at L level at this timing.

Inverter 1412 includes P-channel MOS transistors P12 and P13 and an N-channel MOS transistor N8. Inverter 1412 is activated along with differential amplifier 1406 when signal /PAE is at L level, and inverts and outputs the signal on differential amp node /PAN to a node ND5.

Inverter 1414 includes P-channel MOS transistors P14 and P15 and an N-channel MOS transistor N9. Inverter 1414 is activated when signal /PAEC is at L level, and inverts and outputs the signal on node ND5 to a node ND6.

Latch circuit 1418 includes inverters 1428 and 1430. Similar to latch circuit 1416, latch circuit 1418 also latches the signal on data line /PD3 for a period during which signal /PAEC is at H level after differential amplifier 1406 amplifies the signals on differential amp nodes PAN and /PAN and is then inactivated, that is, until signal PACL goes to H level in order to read the next read data.

Then, when signal PACL goes to H level, signal CLRES output from CLRES generation circuit 136 goes to H level and signal /PAEC output from /PAEC generation circuit 138 goes to L level, so that latch circuit 1418 resets data line /PD3 to L level at this timing.

FIGS. 17 and 18 are circuit diagrams showing a circuit configuration of latency shifter 124. Latency shifter 124 includes an RDT input circuit 152 and a shift circuit 154.

Referring to FIG. 17, RDT input circuit 152 includes an inverter 1522 receiving and inverting signal RDT and outputting signal /RDT, an NOR gate 1524 receiving signal CLRES output from CLRES generation circuit 136 described above and signal /RDT to output signal RDSFT, and an inverter 1526 receiving and inverting signal RDSFT and outputting signal /RDSFT.

As described above, signal RDT received from the control circuit (not shown) is a signal for determining the timing for outputting the read data amplified by amplifier circuit 222 onto data bus pair DB and /DB. Signal RDT is generated starting from a clock cycle following a clock cycle that is a starting point of generating column decode enable signal CDE. More specifically, the data read from the memory cell array from a clock cycle #0 as a starting point is output onto data bus pair DB and /DB from a clock cycle #1 one cycle after clock cycle #0, as a starting point. Therefore, the read data shifts to the next stage in the pipeline.

Signal RDSFT generated by RDT input circuit 152 is at H level when signal CLRES and signal RDT are respectively at L level and H level. At this point, an inverter on an input stage in a shift circuit 154 described later is inactivated and an inverter latching the signals on data line pair /PD4 and PD4 in shift circuit 154 is activated. More specifically, when signal RDT providing a timing for outputting the read data onto data bus pair DB and /DB goes to H level, latency shifter 124 is isolated from amplifier circuit 222 in response to signal RDSFT and the signal taken-in from amplifier circuit 222 by latency shifter 124 is latched at this time point. Furthermore, signal /RDT is an inverted signal of signal RDT for providing a timing for outputting data received from amplifier circuit 222 by shift circuit 154 onto data line pair PDD and /PDD in shift circuit 154 described later.

Shift circuit 154 includes inverters 1542–1564.

Inverter 1542 receives the signal on data line PD3 and inverts and outputs the signal on data line PD3 to data line /PD4 when signal RDSFT is at L level (signal /RDSFT is at H level). Inverter 1544 receives and inverts the signal on data line /PD4. Inverter 1546 receives the output from inverter 1544 and inverts and outputs the received signal to data line /PD4 when signal RDSFT is at H level (signal /RDSFT is at L level). Inverters 1544 and 1546 form a latch circuit when signal RDSFT is at H level, so that the signal on data line /PD4 is latched.

Inverter 1548 receives the signal on data line /PD4 and outputs the signal on data line /PD4 to data line PDD when signal /RDT goes to L level (that is, signal RDT is at H level). Furthermore, inverter 1548 keeps data line PDD at L level when signal /RDT is at H level (that is, signal RDT is at L level). Inverter 1550 receives and inverts the signal on data line PDD. Inverter 1552 receives and inverts the output from inverter 1550 for output onto data line PDD.

Inverter 1548 includes P-channel MOS transistors P16 and P17 and an N-channel MOS transistor N10. P-channel MOS transistor P16 is connected to a power supply node VDD and P-channel MOS transistor P17 and has its gate connected to data line /PD4. P-channel MOS transistor P17 is connected to P-channel MOS transistor P16 and data line PDD and receives signal /RDT at its gate. N-channel MOS transistor N10 is connected to data line PDD and a ground node GND and receives signal /RDT at its gate. Furthermore, inverters 1550 and 1552 form a latch circuit, so that the signal on data line PDD is latched.

Inverter 1554 receives the signal on data line /PD3 and inverts the signal on data line /PD3 for output onto data line PD4 when signal RDSFT is at L level (signal /RDSFT is at H level). Inverter 1556 receives and inverts the signal on data line PD4. Inverter 1558 receives the output from inverter 1556 and inverts the received signal for output onto data line PD4 when signal RDSFT is at H level (signal /RDSFT is at L level). Inverters 1556 and 1558 form a latch circuit when signal RDSFT is at H level, so that the signal on data line PD4 is latched.

Inverter 1560 receives the signal on data line PD4 and outputs the signal on data line PD4 onto data line /PDD when signal /RDT goes to L level (that is, signal RDT is at H level). Furthermore, inverter 1560 keeps data line /PDD at L level when signal /RDT is at H level (that is, signal RDT is at L level). Inverter 1562 receives and inverts the signal on data line /PDD. Inverter 1564 receives and inverts the output from inverter 1562 for output onto data line /PDD.

Inverter 1560 includes P-channel MOS transistors P18 and P19 and an N-channel MOS transistor N11. P-channel MOS transistor P18 is connected to power supply node VDD and P-channel MOS transistor P19 and has its gate connected to data line PD4. P-channel MOS transistor P19 is connected to P-channel MOS transistor P18 and data line /PDD and receives signal /RDT at its gate. N-channel MOS transistor N11 is connected to data line /PDD and ground node GND and receives signal /RDT at its gate. Furthermore, inverters 1562 and 1564 form a latch circuit, so that the signal on data line /PDD is latched.

Now, as signal CLRES generated in CLRES generation circuit 136 of amplifier circuit 222 goes to H level, signals RDSFT and /RDSFT go to L level and H level, respectively, so that inverters 1542 and 1554 are activated. At this time point, the signals on data line pair PD3 and /PD3 reset at L level by signal CLRES at this point are inverted by inverters 1542 and 1554 and data line pair /PD4 and PD4 are reset at H level. More specifically, signal CLRES goes to H level previously before signal PAE activating differential amplifier 1406 goes to H level, and therefore data line pair /PD4 and PD4 are reset before differential amplifier 1406 is activated. Then, inverters 1542 and 1554 receive the respective read data output from amplifier circuit 222 onto data line pair PD3 and /PD3 and inverts the respective data to be output onto data line pair /PD4 and PD4.

Thereafter, when signal RDT goes to H level, signals RDSFT and /RDSFT go to H level and L level, respectively, so that both inverters 1542 and 1554 are inactivated. On the other hand, both inverters 1546 and 1558 are activated and the signals on data line pair /PD4 and PD4 are latched by inverters 1546 and 1558. Then, signal /RDT goes to L level in response to signal RDT going to H level, so that inverters 1548 and 1560 are activated and the signals on data line pair /PD4 and PD4 are inverted to be output onto data line pair PDD and /PDD, respectively.

FIG. 19 is a circuit diagram showing a circuit configuration of driver 126.

Referring to FIG. 19, driver 126 includes a one-shot pulse generation circuit 162, a DB drive circuit 164 and a /DB drive circuit 166.

One-shot pulse generation circuit 162 includes an NOR gate 168 receiving the signals on data line pair PDD and /PDD, a delay circuit 170 receiving and delaying the output from NOR gate 168, an inverter 172 receiving and inverting the output from delay circuit 170, and an inverter 174 inverting the output from inverter 172 to output onto a node ND9.

One-shot pulse generation circuit 162 further includes P-channel MOS transistors P20–P23 and N-channel MOS transistors N12–N14. P-channel MOS transistor P20 is connected to power supply node VDD and a node ND7 and has its gate connected to data line PDD. N-channel MOS transistor N12 is connected to node ND7 and a node ND10 and has its gate connected to data line PDD. P-channel MOS transistor P21 is connected to power supply node VDD and node ND7 and has its gate connected to node ND9. P-channel MOS transistor P22 is connected to power supply node VDD and a node ND8 and has its gate connected to data line /PDD. N-channel MOS transistor N13 is connected to node ND8 and node ND10 and has its gate connected to data line /PDD. P-channel MOS transistor P23 is connected to power supply node VDD and node ND8 and has its gate connected to node ND9. N-channel MOS transistor N14 is connected to node ND10 and ground node GND and has its gate connected to node ND9.

The operation of one-shot pulse generation circuit 162 will now be described.

In one-shot pulse generation circuit 162, when both of the signals on data line pair PDD and /PDD are at L level, P-channel MOS transistors P20 and P22 are turned on and N-channel MOS transistors N12 and N13 are turned off. Therefore, both signals /DRV and //DRV output respectively to nodes ND7 and ND8 are at H level. Furthermore, as the output of NOR gate 168 goes to H level, the signal on node ND9 goes to H level and N-channel MOS transistor N14 is turned on.

In this state, when the signal on data line PDD goes to H level, P-channel MOS transistor P20 and N-channel MOS transistor N12 are turned off and on, respectively, so that node ND7 is pulled down by N-channel MOS transistors N12 and N14 and signal /DRV on node ND7 goes to L level. On the other hand, as the output of NOR gate 168 goes to L level, the signal on node ND9 goes to L level after being delayed by a prescribed time of delay circuit 170. Accordingly, P-channel MOS transistor P21 is turned on and N-channel MOS transistor N14 is turned off, so that node ND7 is pulled up by P-channel MOS transistor P21 and signal /DRV on node ND7 is returned to H level. In other words, signal /DRV on node ND7 is at L level for a delay time period of delay circuit 170. It is noted that signal //DRV on node ND8 is always at H level during this time period.

Similarly, when the signal on data line /PDD goes to H level, signal //DRV on node ND8 is at L level for a delay time period of delay circuit 170.

It is noted that one-shot pulse generation circuit 162 is provided in order to reduce power consumption by outputting the signals from DB drive circuit 164 and /DB drive circuit 166 respectively onto data bus pair DB and /DB at small amplitude.

DB drive circuit 164 includes a P-channel MOS transistor P24, an inverter 176 and an N-channel MOS transistor N15. P-channel MOS transistor P24 is connected to power supply node VDD and data bus DB and has its gate connected to node ND7. Inverter 176 receives and inverts the signal /DRV on node ND8. N-channel MOS transistor N15 is connected to data bus DB and ground node GND and receives the output from inverter 176 at its gate.

In DB drive circuit 164, when signal /DRV on node ND7 and signal //DRV on node ND8 are respectively at L level and at H level, that is, when the signal on data line PDD goes to H level, P-channel MOS transistor P24 and N-channel MOS transistor N15 are turned on and off, respectively, so that data bus DB is pulled up to H level. Here, signal /DRV is a one-shot pulse signal being at L level for a delay time period of delay circuit 170, and P-channel MOS transistor P24 is turned off after this delay time period. Therefore, a signal having small amplitude is output onto data bus DB.

/DB drive circuit 166 includes a P-channel MOS transistor P25, an inverter 178 and an N-channel MOS transistor N16. P-channel MOS transistor P25 is connected to power supply node VDD and data bus /DB and has its gate connected to node ND8. Inverter 178 receives and inverts the signal /DRV on node ND7. N-channel MOS transistor N16 is connected to data bus /DB and ground node GND and receives the output from inverter 178 at its gate.

In /DB drive circuit 166, when signal /DRV on node ND7 and signal //DRV on node ND8 are respectively at H level and at L level, in other words, when the signal on data line PDD goes to H level, P-channel MOS transistor P25 and N-channel MOS transistor N16 are turned on and off, respectively, so that data bus /DB is pulled up to H level. Here, signal //DRV is a one-shot pulse signal being at L level for a delay time period of delay circuit 170, and P-channel MOS transistor P25 is turned off after this delay time period. Therefore, a signal having small amplitude is output onto data bus /DB.

FIG. 20 is a timing chart showing waveforms of representative signals in the circuits from bit line pair BL and /BL to data bus pair DB and /DB as described above.

Referring to FIG. 20, it is assumed that READ command is received at the rise of clock cycle #0. Column decode enable signal CDE is generated starting from the rise of clock cycle #0. Column select line CSL is activated by column decode enable signal CDE. When column select line CSL is activated, a small amplitude signal is output from sense amplifier 50 through N-channel MOS transistors N1 and N2 onto I/O line pair LIO and /LIO. Furthermore, either of signals PACL and PAEL has a generation timing determined based on column decode enable signal CDE as a starting point.

Signal PACL goes to H level after being delayed by a delay time of delay circuit 104 with respect to column decode enable signal CDE. CLRES generation circuit 136 outputs signal CLRES at H level in response to signal PACL going to H level. Internal nodes within preamplifier 148 such as data line pair PD3 and /PD3, data line pair /PD4 and PD4 and data line pair PDD and /PDD are reset. Furthermore, in response to signal PACL going to H level, input processing circuit 132 outputs signal /PAEQ at H level and equalizer circuit 1404 is inactivated.

Signal PAEL goes to H level after being delayed by a delay time of delay circuit 106 with respect to signal PACL. For a period from H level of signal PACL to H level of signal PAEL, input processing circuit 132 outputs signal PADT at H level. Responsively, input circuit 1402 in amplify/output circuit 240 connects I/O line pair LIO and /LIO respectively to differential amp nodes PAN and /PAN and data on I/O line pair LIO and /LIO is input into preamplifier 148.

Furthermore, when signal PAEL goes to H level, PAE generation circuit 234 outputs signals PAE and /PAE respectively at H level and L level. Responsively, differential amplifier 1406 is activated and the small amplitude signals on differential amp nodes PAN and /PAN are amplified to full amplitude. The signals on differential amp nodes PAN and /PAN are then transmitted onto data line pair /PD4 and PD4 via data line pair PD3 and /PD3.

The data transmitted onto data line pair /PD4 and PD4 are output onto data line pair PDD and /PDD in response to signals RDT and /RDT and one-shot pulse generation circuit 162 generates pulse signals /DRV and //DRV. In response to pulse signals /DRV and //DRV, DB drive circuit 164 and /DB drive circuit 166 are driven and data is output with small amplitude signals onto data bus pair DB and /DB.

Propagation of read data described above is carried out such that N-th (N is a natural number) data read out from the memory cell array is propagated from the memory cell array to data line pair /PD4 and PD4, starting from external clock CLK (N−1) cycles after external clock CLK receiving READ command. More specifically, the first output data is triggered by column decode enable signal CDE generated starting from clock cycle #0 in which READ command is received, and reaches data line pair /PD4 and PD4.

On the other hand, signals RDT and /RDT determining a timing for outputting data arriving on data line pair /PD4 and PD4 onto data bus pair DB and /DB are generated starting from external clock CLK one cycle after external clock CLK that is a starting point of column decode enable signal CDE. More specifically, signals RDT and /RDT determining a timing for outputting data read out from the memory cell array for the first time onto data bus pair DB and /DB are generated starting from clock cycle #1 following clock cycle #0 receiving READ command. Therefore, at the time data is output onto data bus pair DB and /DB, the timing is shifted by one cycle and data is moved onto the next stage in the pipeline.

The circuit operation as described above realizes the pipeline operation in a situation where data read from the memory cell array is output onto data bus pair DB and /DB. In case of CAS latency CL of 2.0, assuming that one stage of the pipeline is from data bus pair DB and /DB to a parallel/serial conversion circuit, if DLL clock received by the output buffer ultimately outputting the read data to the outside corresponds to external clock CLK two cycles after external clock CLK that is a starting point of column decode enable signal CDE, the read data is output from the parallel/serial conversion circuit to the output buffer in synchronization with DLL clock, so that the read data is output from the memory cell array to the outside precisely for two cycles.

Assuming that the timing of receiving READ command is provided in clock cycle #0, Tb represents the time required for the N-th read data to arrive on data line pair /PD4 and PD4 from the rise of clock cycle # (N−1) that is a starting point of reading that read data, and Tc represents the time required to generate signal /RDT in preamplifier 148 from clock cycle #N that is a starting point of signal RDT determining the timing of outputting the read data arriving on data line pair /PD4 and PD4 onto data bus pair DB and /DB. (In FIG. 20, a case where N=1 is shown.)

As signal /RDT is generated from signal RDT, signal /RDT corresponding to the N-th read data is generated (Tck+Tc) after external clock CLK which is a starting point of reading that read data, where Tck represents the period of external clock CLK.

Here, if the operation frequency is high and Tb>(Tck+Tc), in other words, if Tck<(Tb−Tc), signal /RDT is generated in preamplifier 148 before the read data arrives on data line pair /RD4 and RD4. In this case, the timing at which the read data is output onto data bus pair DB and /DB is not provided on the falling edge of signal /RDT but at the timing when the read data propagates from data line pair PD3 and /PD3 onto data line pair /PD4 and PD4.

Then, a number of circuit elements exist until the read data arrives on data line pair /PD4 and PD4 after signal PAE goes to H level and differential amplifier 1406 starts operating. Therefore, a long waiting time occurs from H level of signal RDT to the actual reading of the read data onto data bus pair DB and /DB. This means that the time for the read data to propagate in the next stage is progressively longer if period Tck of external clock CLK is shorter than a certain time period. Therefore, the conventional circuit configuration cannot support a sufficient high frequency operation.

SUMMARY OF THE INVENTION

Therefore the present invention is made to solve such a problem. An object of the present invention is to provide a semiconductor memory device with faster propagation of read data from a preamplifier onto a data bus pair in a high frequency operation.

In accordance with the present invention, a semiconductor memory device is provided in which data is input/output in synchronization with a rise and a fall of an external clock. The semiconductor memory device includes: a memory cell array storing data; a control circuit producing first and second signals starting based on an adjacent clock cycle as a starting point; a preamplifier amplifying read data read from the memory cell array for output onto a data bus based on the first and second signals; and a data output circuit externally outputting the read data output onto the data bus. The preamplifier amplifies a signal level of the read data based on the first signal and outputs the read data having the amplified signal level onto the data bus based on the second signal when a timing of receiving the second signal is later than a timing of receiving the first signal, and amplifies a signal level of the read data based on the first signal and outputs the read data having the amplified signal level onto the data bus based on the first signal when a timing of receiving the second signal is earlier than a timing of receiving the first signal.

Preferably, the preamplifier includes an amplifier circuit receiving the first and second signals to amplify a signal level of the read data based on the first signal, a data shift circuit receiving the second signal to shift the read data having the signal level amplified by the amplifier circuit based on the second signal, and a driver outputting the read data onto the data bus. When a timing of receiving the second signal is later than a timing of receiving the first signal in the amplifier circuit, the amplifier circuit outputs the read data having the amplified signal level to the data shift circuit and the data shift circuit outputs the read data shifted based on the second signal to the driver. When a timing of receiving the second signal is earlier than a timing of receiving the first signal in the amplifier circuit, the amplifier circuit outputs the read data having the amplified signal level to the driver based on the first signal.

Preferably, the amplifier circuit further outputs the read data having the amplified signal level to the driver based on the second signal when a timing of receiving the second signal is later than a timing of receiving the first signal, and further outputs the read data having the amplified signal level to the data shift circuit based on the first signal when a timing of receiving the second signal is earlier than a timing of receiving the first signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram showing an overall configuration of a semiconductor memory device in accordance with the present invention.

FIG. 2 is a functional block diagram functionally illustrating a circuit configuration from a bit line pair to a data bus pair in the semiconductor memory device in accordance with the present invention.

DESCRIPTION OF THE PREFERRED EMBODIMENT

Figure 3:
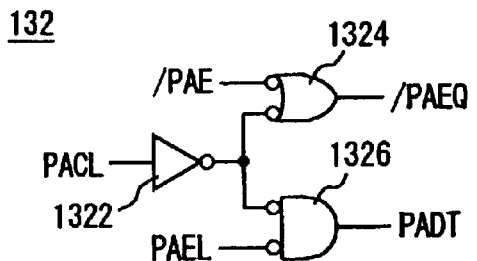
FIG. 3 is a first circuit diagram showing a circuit configuration of an amplifier circuit shown in FIG. 2.

In the following, an embodiment of the present invention will be described with reference to the figures. It is noted that in the figures the same or corresponding parts will be denoted with the same reference characters and therefore description thereof will not be repeated.

FIG. 1 is a schematic block diagram showing an overall configuration of a semiconductor memory device 10 in accordance with the present invention.

Referring to FIG. 1, semiconductor memory device 10 includes a clock terminal 12, a control signal terminal 14, an address terminal 16, a data input/output terminal 18 and a data strobe signal input/output terminal 20.

Semiconductor memory device 10 further includes a clock buffer 22, a control signal buffer 24, an address buffer 26, an input buffer 28 and an output buffer 30 for data DQ, and an input buffer 32 and an output buffer 34 for data strobe signals UDQS and LDQS.

Semiconductor memory device 10 further includes a read amplifier &P/S (parallel/serial) conversion circuit 36, an S/P (serial/parallel) conversion circuit &write driver 38 and a DQS generation circuit 40.

In addition, semiconductor memory device 10 further includes a control circuit 42, a row decoder 44, a column decoder 46, a preamplifier & write amplifier 48, a sense amplifier 50, a memory cell array 52, and a DLL circuit 54.

It is noted that in FIG. 1, only main parts for data input/output in semiconductor memory device 10 are representatively shown.

Semiconductor memory device 10 has a two-bit prefetch configuration in which data of 2×n bits (n represents a bit-width in the semiconductor memory device) is read out in a single readout in the reading of data from memory cell array 52 every cycle. More specifically, data of two bits is read from memory cell array 52 to each of n data output circuits every one cycle and data of two bits is then ordered in each of the data output circuits and is transferred to be externally output every half cycle.

On the other hand, in writing data, semiconductor memory device 10 takes in data of n bits every half cycle in synchronization with a rise and a fall of a data strobe signal and writes data corresponding to two half cycles into memory cell array 52 every one cycle.

Clock terminal 12 receives external clock CLK, a complimentary external clock /CLK and a clock enable signal CKE. Control signal terminal 14 receives command control signals of a chip select signal /CS, a row address strobe signal /RAS, a column address strobe signal /CAS, a write enable signal /WE and input/output DQ mask signals UDM and LDM. Address terminal 16 receives address signals A0–A12 and bank address signals BA0 and BA1.

Clock buffer 22 receives external clocks CLK and /CLK and clock enable signal CKE to generate an internal clock to be output to control signal buffer 24, address buffer 26, control circuit 42 and DLL circuit 54. Control signal buffer 24 takes in and latches chip select signal /CS, row address strobe signal /RAS, column address strobe signal /CAS, write enable signal /WE and input/output DQ mask signals UDM and LDM and outputs the command control signals to control circuit 42, in synchronization with the internal clock received from clock buffer 22. Address buffer 26 takes in and latches address signals A0–A12 and bank address signals BA0 and BA1 and generates an internal address signal to be output to row decoder 44 and column decoder 46, in synchronization with the internal clock received from clock buffer 22.

Data input/output terminal 18 externally communicates data read and written in semiconductor memory device 10. It receives data DQ externally input in writing data and externally outputs data DQ in reading data. Data strobe signal input/output terminal 20 externally receives data strobe signals UDQS and LDQS for externally reading data DQ in writing data, and outputs data strobe signals UDQS and LDQS for an external controller to read data DQ in reading data.

Input buffer 28 inputs data DQ in synchronization with data strobe signals UDQS and LDQS externally received by input buffer 32.

Output buffer 30 operates in synchronization with a DLL clock generated based on the internal clock generated in DLL circuit 54 and outputs data DQ to data input/output terminal 18 every half cycle. Output buffer 34 operates in synchronization with DLL clock along with output buffer 30 outputting data DQ, and outputs data strobe signals UDQS and LDQS generated by DQS generation circuit 40 to data strobe signal input/output terminal 20.

In reading data, read amplifier &P/S conversion circuit 36 amplifies the read data received from preamplifier &write amplifier 48 and orders data of two bits read at one time for each data DQi (i=0–(n–1)) to be output to output buffer 30. In writing data, S/P conversion circuit & write driver 38 outputs each data DQi received from input buffer 28 bit by bit every half cycle to preamplifier & write amplifier 48 by two bits in parallel every one cycle.

Control circuit 42 takes in the command control signal in synchronization with the aforementioned DLL clock or the internal clock from clock buffer 22 and controls row decoder 44, column decoder 46 and preamplifier &write amplifier 48 based on the taken-in command control signal. Data DQ is thus read from and written into memory cell array 52. Control circuit 42 further controls generation of the data strobe signal in DQS generation circuit 40 based on the taken-in command control signal.

Memory cell array 52 storing data is formed of four banks each capable of operating independently and data reading and writing is performed through sense amplifier 50.

DLL circuit 54 outputs DLL clocks CLK_P and CLK_N generated by delaying external clock CLK to output buffers 30 and 34, read amplifier &P/S conversion circuit 36, DQS generation circuit 40 and control circuit 42.

In semiconductor memory device 10 in accordance with the present invention, a so-called pipeline operation is performed in which when READ command is received for outputting data, data read from memory cell array 52 is appropriately shifted in synchronization with internal clocks CLK_P and CLK_N and is ultimately delivered to the output buffer. More specifically, data read from memory cell array 52 sequentially passes through each stage forming the pipeline at an appropriate timing synchronized with internal clocks CLK_P and CLK_N and arrives at output buffer 30. Although a variety of configurations may be employed in a stage of the pipeline, in semiconductor memory device 10 according to the present invention, a first stage may correspond to a segment up until the read data is output onto data bus pair DB and /DB transmitting the read data output from preamplifier 48 to read amplifier &P/S conversion circuit 36.

FIG. 2 is a functional block diagram functionally illustrating the circuit configuration from bit line pair BL and /BL to data bus pair DB and /DB in the first stage described above.

Referring to FIG. 2, when rows are activated in memory cell array 52 (not shown), a word line (not shown) indicated by an externally received row address is activated and data is read from memory cell array 52 onto bit line pair BL and /BL. Sense amplifier 50 detects and amplifies the data read onto bit line pair BL and /BL.

Thereafter, when READ command is received, a decode signal YA corresponding to an externally received column address goes to H level and after an appropriate delay time period, column decode enable signal CDE for activating column select line CSL goes to H level. Therefore, the output of an AND gate 108 goes to H level and one common select line CSL corresponding to the column address is selected. Data is then output at small amplitude from sense amplifier 50 through N-channel MOS transistors N1 and N2 onto I/O line pair LIO and /LIO equalized to H level by I/O equalizer 102 in advance during a period in which data is not transmitted. Data on I/O line pair LIO and /LIO is then input to preamplifier 48.

Preamplifier 48 amplifying and outputting the small amplitude signals on I/O line pair LIO and /LIO onto data bus pair DB and /DB includes an amplifier circuit 122, a latency shifter 124 and a driver 126. Here, latency shifter 124 configures a data shift circuit.

Amplifier circuit 122 amplifies the small amplitude signals on I/O line pair LIO and /LIO. Amplifier circuit 122 resets the internal state based on a signal PACL output from delay circuit 104 and amplifies the small amplitude signals on I/O line pair LIO and /LIO using a differential amplifier included therein based on a signal PAEL output from delay circuit 106.

Amplifier circuit 122 receives a signal RDT from control circuit 42 (not shown) and outputs an amplified signal onto data line pair PD3 and /PD3 when signal RDT is at L level. On the other hand, amplifier circuit 122 outputs the amplified signal onto data line pair PDD and /PDD while bypassing latency shifter 124 when signal RDT is at H level.

Latency shifter 124 holds data received from data line pair PD3 and /PD3 until signal RDT goes to H level, and outputs the data onto data line pair PDD and /PDD at a timing when signal RDT goes to H level. Driver 126 outputs the data received from data line pair PDD and /PDD onto data bus pair DB and /DB at small amplitude.

Here, signal RDT input into amplifier circuit 122 and latency shifter 124 determines a timing at which data is moved from a first stage to a second stage in a pipeline operation. It determines a timing at which data amplified by amplifier circuit 122 is output onto data bus pair DB and /DB. Signal RDT is generated by control circuit 42 (not shown), starting from a clock cycle following a clock cycle that is a starting point of reading corresponding data from memory cell array 52.

Delay circuit 104 receives column decode enable signal CDE and outputs signal PACL produced by delaying column decode enable signal CDE by an appropriate amount to delay circuit 106 and an amplifier circuit 122 in preamplifier 48. This signal PACL provides a timing for resetting the internal state in preamplifier 48. Delay circuit 106 receives signal PACL output from delay circuit 104 and outputs signal PAEL produced by delaying signal PACL by an appropriate amount to amplifier circuit 122. This signal PAEL provides a timing for amplifying and outputting the signal received from I/O line pair LIO and /LIO to latency shifter 124, in amplifier circuit 122 in preamplifier 48.

FIGS. 3–7 are circuit diagrams showing the circuit configuration of amplifier circuit 122. Amplifier circuit 122 includes an input processing circuit 132, a PAE generation circuit 134, a CLRES generation circuit 136, a /PAEC generation circuit 138 and an amplify/output circuit 140.

Referring to FIG. 3, input processing circuit 132 includes an inverter 1322 receiving and inverting signal PACL, an NAND gate 1324 receiving signal /PAE generated by PAE generation circuit 134 and the output from inverter 1322 to output signal /PAEQ, and an NOR gate 1326 receiving signal PAEL and the output from inverter 1322 to output signal PADT.

Signal /PAEQ generated in response to signal PACL output from delay circuit 104 is a signal for equalizing differential amp nodes PAN and /PAN in amplify/output circuit 140 described later. Furthermore, signal PADT generated in response to signal PAEL output from delay circuit 106 is a signal being at H level from H level of signal PACL to H level of signal PAEL, for connecting differential amp nodes PAN and /PAN to I/O line pair LIO and /LIO to take in data on I/O line pair LIO and /LIO into preamplifier 48, in amplify/output circuit 140 described later.

Figure 4:
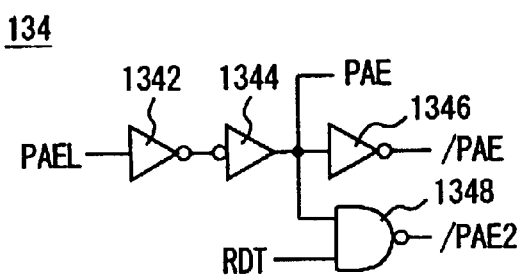
FIG. 4 is a second circuit diagram showing the circuit configuration of the amplifier circuit shown in FIG. 2.

Referring to FIG. 4, PAE generation circuit 134 includes an inverter 1342 receiving and inverting signal PAEL, an inverter 1344 receiving and inverting the output from inverter 1342 to output signal PAE, an inverter 1346 receiving and inverting signal PAE to output signal /PAE, and an NAND gate 1348 receiving signal PAE and signal RDT to output signal /PAE2.

Signals PAE and /PAE generated in response to signal PAEL are signals for activating a differential amplifier included in amplify/output circuit 140 described later. Furthermore, signal /PAE2 is a signal for outputting the signal amplified by the differential amplifier onto data line pair PDD and /PDD while bypassing latency shifter 124 if signal RDT determining a timing of outputting read data onto data bus pair DB and/DB is already at H level when signal PAE goes to H level and the differential amplifier is activated.

Figure 5:
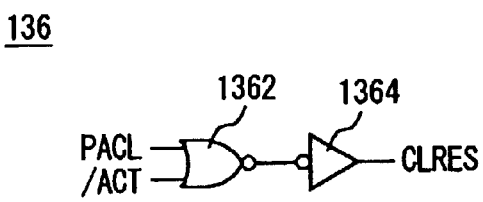
FIG. 5 is a third circuit diagram showing the circuit configuration of the amplifier circuit shown in FIG. 2.

Referring to FIG. 5, CLRES generation circuit 136 includes an NOR gate 1362 receiving signal PACL and a signal /ACT and an inverter 1364 receiving and inverting the output from NOR gate 1362 to output signal CLRES. Here, signal /ACT is received from control circuit 42 (not shown) and is at L level when rows are activated.

Signal CLRES generated in response to signal PACL is a signal for resetting a latch circuit following the differential amplifier included in amplify/output circuit 140 described later.

Figure 6:
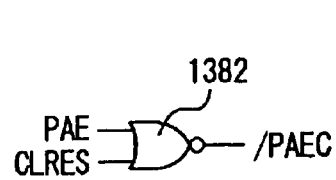
FIG. 6 is a fourth circuit diagram showing the circuit configuration of the amplifier circuit shown in FIG. 2.

Referring to FIG. 6, /PAEC generation circuit 138 includes an NOR gate 1382 receiving signal PAE generated by PAE generation circuit 134 and signal CLRES generated by CLRES generation circuit 136 to output signal /PAEC.

Signal /PAEC is a signal for activating the latch circuit following the differential amplifier in amplify/output circuit 140 described later.

Figure 7:
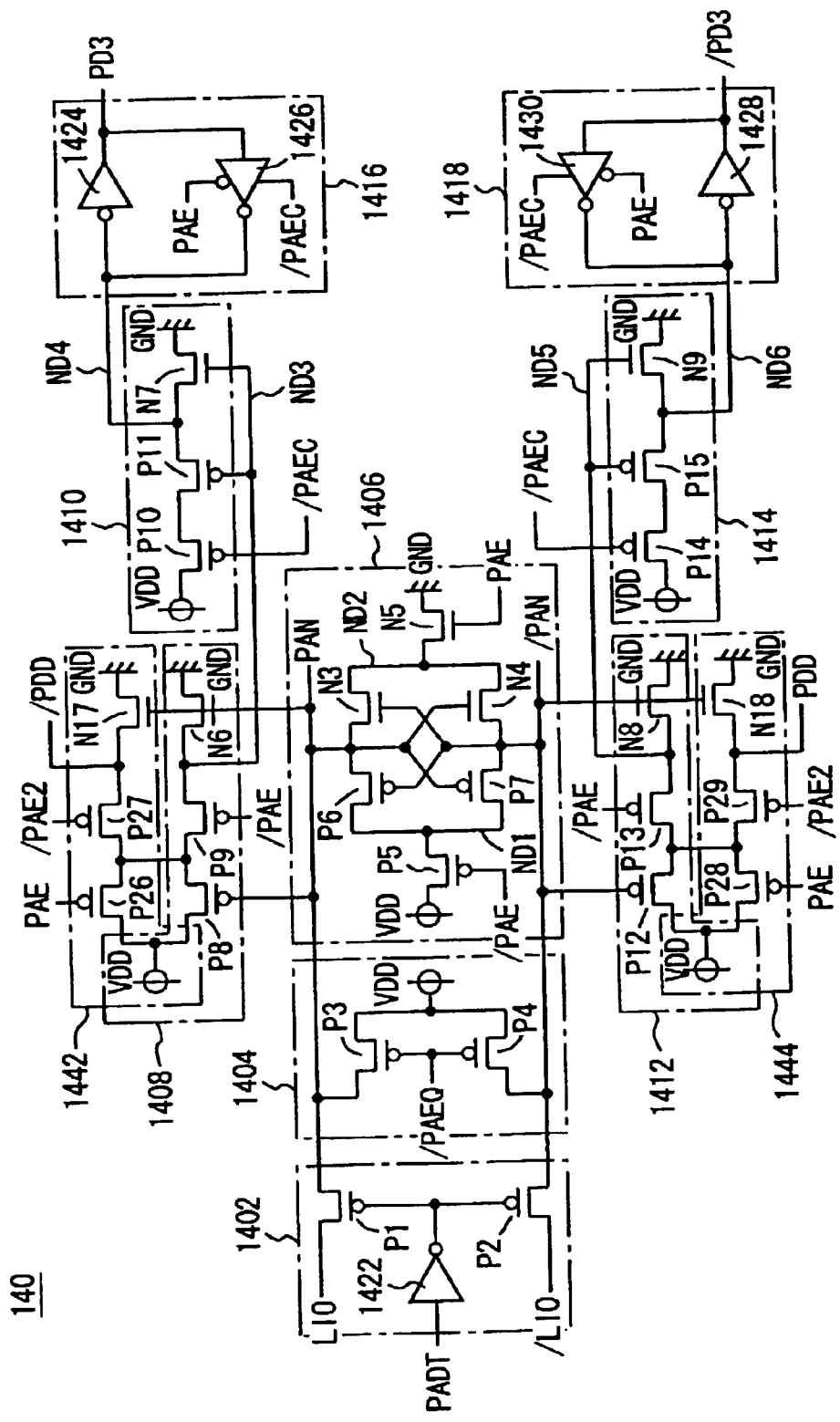
FIG. 7 is a fifth circuit diagram showing the circuit configuration of the amplifier circuit shown in FIG. 2.

Referring to FIG. 7, amplify/output circuit 140 includes an input circuit 1402, an equalizer circuit 1404, a differential amplifier 1406, inverters 1408–1414, 1442 and 1444 and latch circuits 1416 and 1418.

Input circuit 1402 includes an inverter 1422 receiving and inverting signal PADT generated by input processing circuit 132 and P-channel MOS transistors P1 and P2. P-channel MOS transistor P1 is connected to I/O line LIO and a differential amp node PAN and receives the output from inverter 1422 at its gate. Furthermore, P-channel MOS transistor P2 is connected to I/O line /LIO and a differential amp node /PAN and receives the output from inverter 1422 at its gate.

Input circuit 1402 connects I/O line pair LIO and /LIO respectively to differential amp nodes PAN and /PAN to transmit data on I/O line pair LIO and /LIO to differential amp nodes PAN and /PAN when signal PADT goes to H level.

Equalizer circuit 1404 includes P-channel MOS transistors P3 and P4. P-channel MOS transistor P3 is connected to power supply node VDD and differential amp node PAN and receives at its gate signal /PAEQ generated by input processing circuit 132. Furthermore, P-channel MOS transistor P4 is connected to power supply node VDD and differential amp node /PAN and receives signal /PAEQ at its gate.

Equalizer circuit 1404 equalizes differential amp nodes PAN and /PAN at H level when signal /PAEQ is at L level.

Differential amplifier 1406 includes P-channel MOS transistors P5–P7 and N-channel MOS transistors N3–N5. P-channel MOS transistor P5 is connected to power supply node VDD and node ND1 and receives signals /PAE generated by PAE generation circuit 134 at its gate. P-channel MOS transistor P6 is connected to node ND1 and differential amp node PAN and has its gate connected to differential amp node /PAN. P-channel MOS transistor P7 is connected to node ND1 and differential amp node /PAN and has its gate connected to differential amp node PAN. N-channel MOS transistor N3 is connected to differential amp node PAN and node ND2 and has its gate connected to differential amp node /PAN. N-channel MOS transistor N4 is connected to differential amp node /PAN and node ND2 and has its gate connected to differential amp node PAN. N-channel MOS transistor N5 is connected to node ND2 and ground node GND and receives signal PAE generated by PAE generation circuit 134 at its gate.

Differential amplifier 1406 is activated by signals PAE and /PAE to amplify the small amplitude signals on differential amp nodes PAN and /PAN transmitted from I/O line pair LIO and /LIO through input circuit 1402 to provide signals fully swinging between a power supply voltage and a ground voltage.

Inverter 1408 includes P-channel MOS transistors P8 and P9 and an N-channel MOS transistor N6. P-channel MOS transistor P8 is connected to power supply node VDD and P-channel MOS transistor P9 and has its gate connected to differential amp node PAN. P-channel MOS transistor P9 is connected to P-channel MOS transistor P8 and node ND3 and receives signal /PAE at its gate. N-channel MOS transistor N6 is connected to node ND3 and ground node GND and has its gate connected to differential amp node PAN.

Inverter 1408 is activated along with differential amplifier 1406 when signal /PAE is at L level, and inverts the signal on differential amplifier node PAN for output to node ND3.

Inverter 1410 includes P-channel MOS transistors P10 and P11 and an N-channel MOS transistor N7. P-channel MOS transistor P10 is connected to power supply node VDD and P-channel MOS transistor P11 and receives signal /PAEC generated by /PAEC generation circuit 138 at its gate. P-channel MOS transistor P11 is connected to P-channel MOS transistor P10 and node ND4 and has its gate connected to node ND3. N-channel MOS transistor N7 is connected to node ND4 and ground node GND and has its gate connected to node ND3.

Inverter 1410 is activated when signal /PAEC is at L level, and inverts the signal on node ND3 for output to node ND4.

Latch circuit 1416 includes an inverter 1424 receiving and inverting the signal on node ND4 for output onto data line PD3, and an inverter 1426 receiving the output from inverter 1424 and inverting the received signal for output to node ND4 when signal PAE and signal /PAEC are respectively at L level and at H level.

Latch circuit 1416 latches the signal on data line PD3 for a period during which signal /PAEC generated by /PAEC generation circuit 138 is at H level after differential amplifier 1406 amplifies the signals on differential amp nodes PAN and /PAN and is then inactivated (signal PAE goes to L level), that is, until signal PACL goes to H level in order to read the next read data.

Then, when signal PACL goes to H level, signal CLRES output from CLRES generation circuit 136 goes to H level and signal /PAEC output from /PAEC generation circuit 138 goes to L level (at this point, signal PAE is at L level until signal PAEL goes to H level), so that latch circuit 1416 resets data line PD3 at L level at this timing.

Inverter 1442 includes P-channel MOS transistors P26 and P27 and an N-channel MOS transistor N17. P-channel MOS transistor P26 is connected to power supply node VDD and P-channel MOS transistor P27 and receives signal PAE at its gate. P-channel MOS transistor P27 is connected to P-channel MOS transistor P26 and data line /PDD and receives signal /PAE2 generated by PAE generation circuit 134 at its gate. N-channel MOS transistor N17 is connected to data line /PDD and ground node GND and has its gate connected to differential amp node PAN.

Inverter 1442 is activated when signal /PAE2 is at L level, inverts the signal on differential amp node PAN and outputs the inverted signal onto data line /PDD while bypassing latency shifter 124.

Inverter 1412 includes P-channel MOS transistors P12 and P13 and an N-channel MOS transistor N8. P-channel MOS transistor P12 is connected to power supply node VDD and P-channel MOS transistor P13 and has its gate connected to differential amp node /PAN. P-channel MOS transistor P13 is connected to P-channel MOS transistor P12 and node ND5 and receives signal /PAE at its gate. N-channel MOS transistor N8 is connected to node ND5 and ground node GND and has its gate connected to differential amp node /PAN.

Inverter 1412 is activated along with differential amplifier 1406 when signal /PAE is at L level, and inverts the signal on differential amp node /PAN for output to node ND5.

Inverter 1414 includes P-channel MOS transistors P14 and P15 and an N-channel MOS transistor N9. P-channel MOS transistor P14 is connected to power supply node VDD and P-channel MOS transistor P15 and receives signal /PAEC at its gate. P-channel MOS transistor P15 is connected to P-channel MOS transistor P14 and node ND6 and has its gate connected to node ND5. N-channel MOS transistor N9 is connected to node ND6 and ground node GND and has its gate connected to node ND5.

Inverter 1414 is activated when signal /PAEC is at L level, and inverts the signal on node ND5 for output to node ND6.

Latch circuit 1418 includes an inverter 1428 receiving and inverting the signal on node ND6 for output onto data line /PD3, and an inverter 1430 receiving the output from inverter 1428 and inverting the received signal for output to node ND6 when signal PAE and signal /PAEC are respectively at L level and at H level.

Similar to latch circuit 1416, latch circuit 1418 latches the signal on data line /PD3 for a period during which signal /PAEC is at H level after differential amplifier 1406 amplifies the signals on differential amp nodes PAN and /PAN and is then inactivated, that is, until signal PACL goes to H level in order to read the next read data.

Then, when signal PACL goes to H level, signal CLRES output from CLRES generation circuit 136 goes to H level and signal /PAEC output from /PAEC generation circuit 138 goes to L level, so that latch circuit 1418 resets data line /PD3 at L level at this timing.

Inverter 1444 includes P-channel MOS transistors P28 and P29 and an N-channel MOS transistor N18. P-channel MOS transistor P28 is connected to power supply node VDD and P-channel MOS transistor P29 and receives signal PAE at its gate. P-channel MOS transistor P29 is connected to P-channel MOS transistor P28 and data line PDD and receives signal /PAE2 at its gate. N-channel MOS transistor N18 is connected to data line PDD and ground node GND and has its gate connected to differential amp node /PAN.

Inverter 1444 is activated when signal /PAE2 is at L level, inverts the signal on differential amp node /PAN and outputs the inverted signal to data line PDD while bypassing latency shifter 124.

Returning to FIG. 2, it is noted that the circuit configuration of latency shifter 124 and driver 126 in preamplifier 48 is same as that of the conventional technique. The circuit configuration of the conventional technique has already been described and therefore description thereof will not be repeated.

Figure 11:
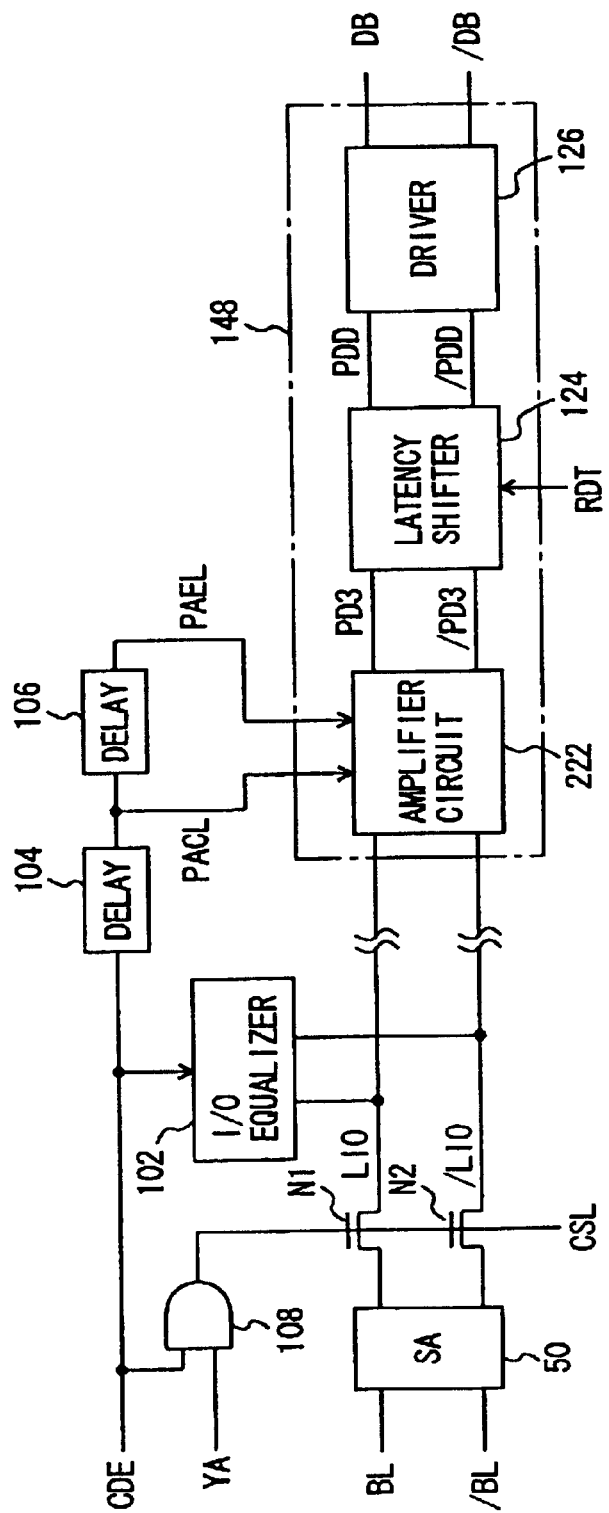
FIG. 11 is a functional block diagram functionally illustrating a circuit configuration from a bit line pair to a data bus pair in a conventional semiconductor memory device.
Figure 12:
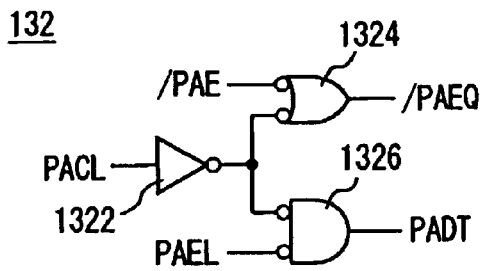
FIG. 12 is a first circuit diagram showing a circuit configuration of an amplifier circuit shown in FIG. 11.
Figure 13:
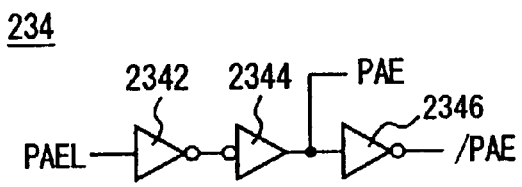
FIG. 13 is a second circuit diagram showing the circuit configuration of the amplifier circuit shown in FIG. 11.
Figure 14:
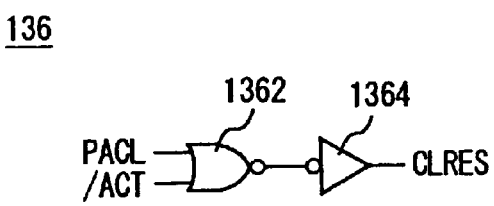
FIG. 14 is a third circuit diagram showing the circuit configuration of the amplifier circuit shown in FIG. 11.
Figure 15:
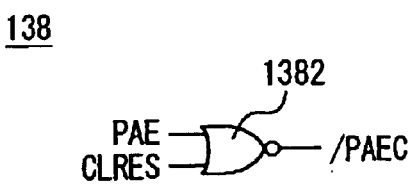
FIG. 15 is a fourth circuit diagram showing the circuit configuration of the amplifier circuit shown in FIG. 11.
Figure 16:
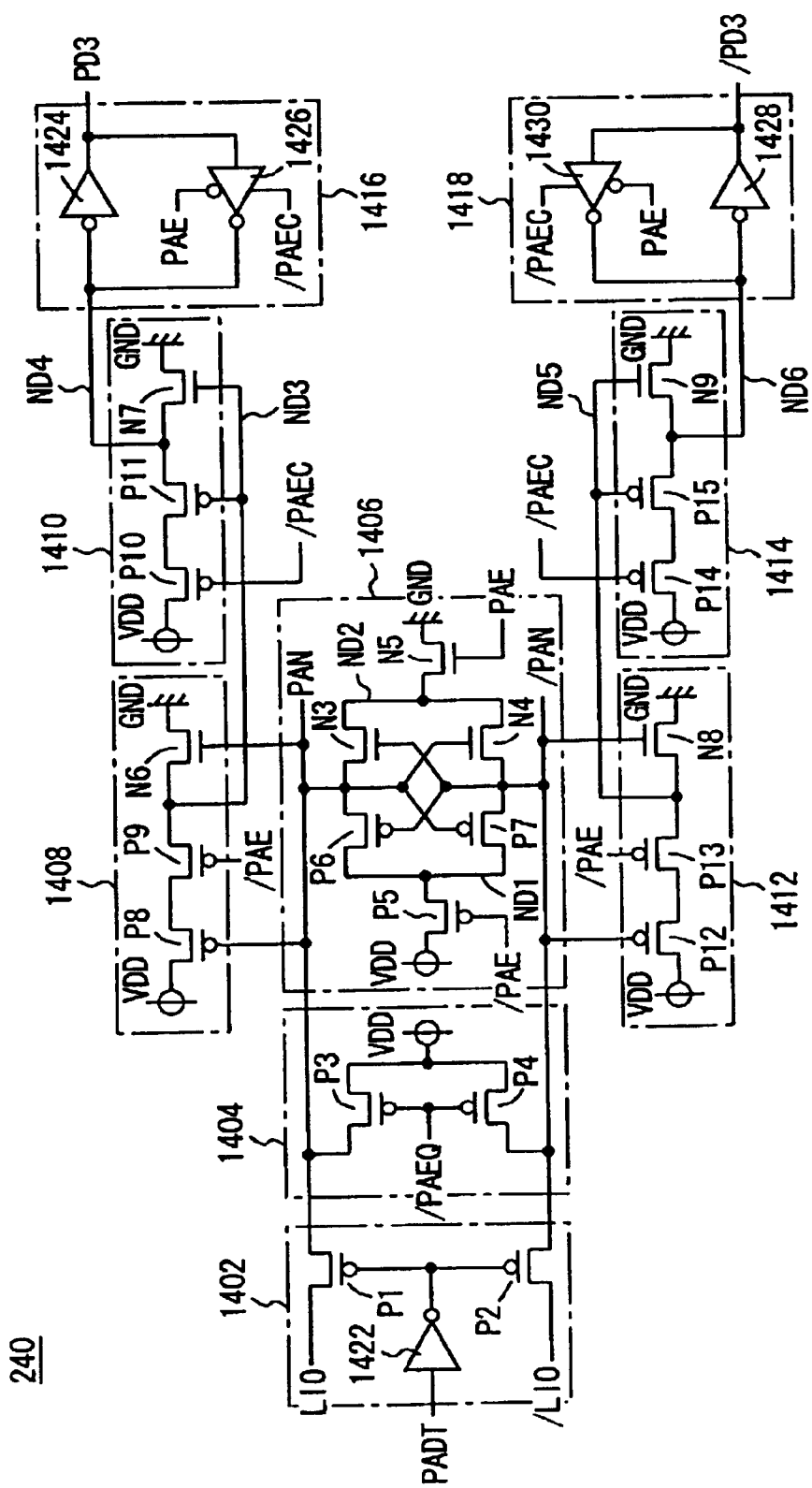
FIG. 16 is a fifth circuit diagram showing the circuit configuration of the amplifier circuit shown in FIG. 11.
Figure 17:
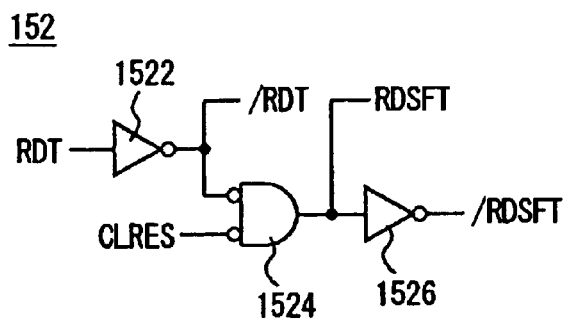
FIG. 17 is a first circuit diagram showing a circuit configuration of a latency shifter shown in FIG. 11.
Figure 18:
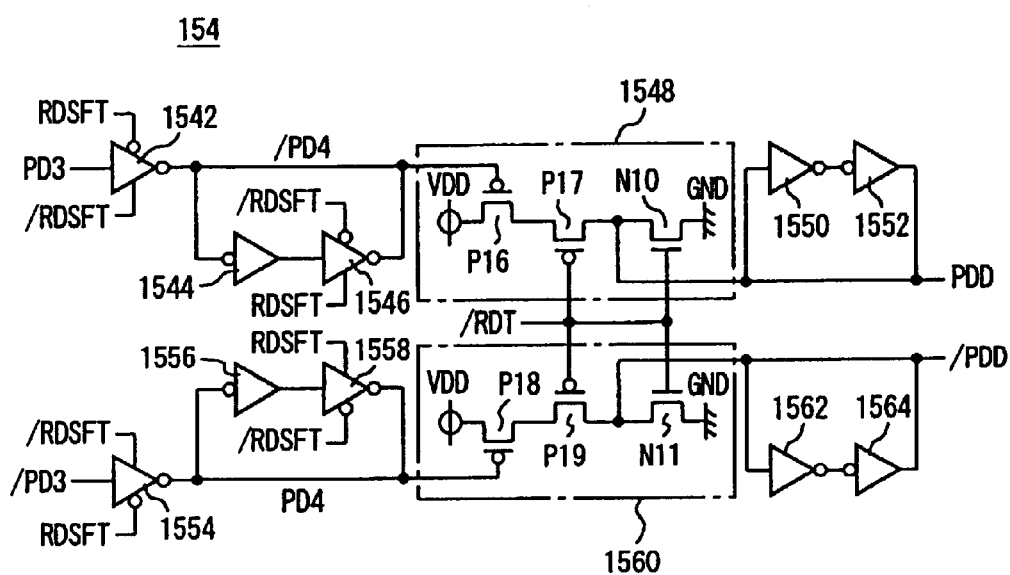
FIG. 18 is a second circuit diagram showing the circuit configuration of the latency shifter shown in FIG. 11.
Figure 19:
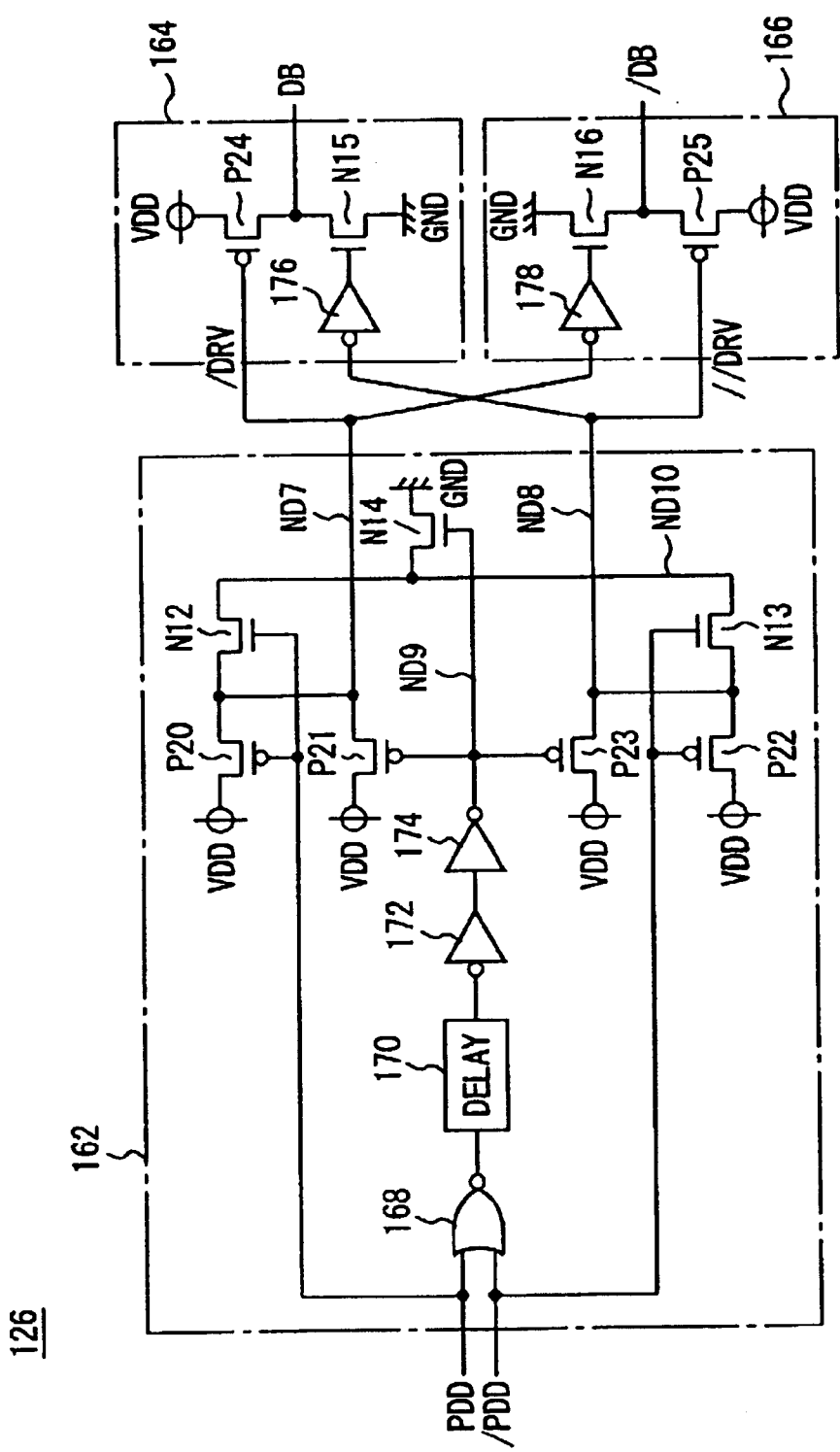
FIG. 19 is a circuit diagram showing a circuit configuration of a driver shown in FIG. 11.
Figure 20:
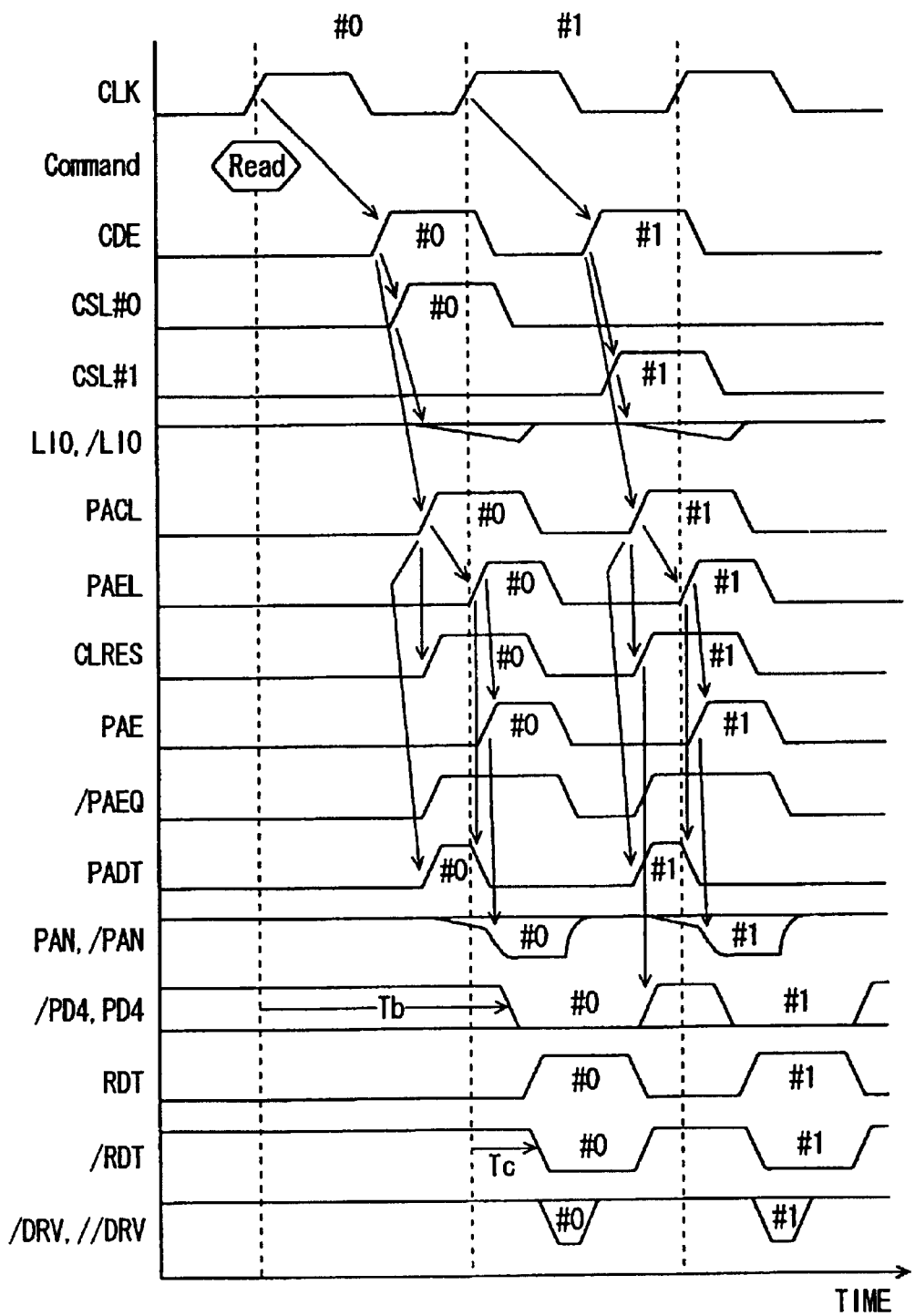
FIG. 20 is a timing chart showing waveforms of representative signals in the circuits from the bit line pair to the data bus pair in the conventional technique.

This preamplifier 48 differs from the conventional preamplifier 148 shown in FIG. 11 in that amplifier circuit 122 also receives signal RDT and in that a signal path is provided through which data is output from amplifier circuit 122 directly onto data line pair PDD and /PDD while bypassing latency shifter 124.

The reason for such a configuration is as follows. When the operation frequency is low in semiconductor memory device 10, data read from the memory cell according to a clock cycle #0 is provided with a signal level amplified by amplifier circuit 122 and thereafter is output onto data bus pair DB and /DB by latency shifter 124 and driver 126, in response to signal RDT generated according to a clock cycle #1 following clock cycle #0.

However, signal PAE determining the timing of taking in data from I/O line pair LIO and /LIO to amplify a signal level in preamplifier 48 is produced a certain time period after clock cycle #0 irrespective of the operation frequency of semiconductor memory device 10. Therefore, when the operation frequency of semiconductor memory device 10 is higher, signal RDT produced according to clock cycle #1 goes to H level prior to signal PAE.

Then, at the time the signal level of the read data is amplified by amplifier circuit 122 in response to signal PAE, the timing at which the read data should be output from preamplifier 48 onto data bus pair DB and /DB in response to signal RDT has already elapsed. Therefore, in order to properly carry out the pipeline operation, it is necessary to reduce the transmission time of data as much as possible to output data onto data bus pair DB and /DB.

Considering the foregoing, in preamplifier 48, amplifier circuit 122 also receives signal RDT. When signal RDT is already at H level at the time of activation of differential amplifier 1406 by signals PAE and /PAE, amplifier circuit 122 outputs the signal amplified by differential amplifier 1406 directly onto data bus pair PDD and/PDD by bypassing latency shifter 124. Therefore, the transmission time of the read data is reduced.

It is noted that in amplifier circuit 122 in preamplifier 48, the circuit is configured such that read data is not directly output from amplify/output circuit 140 onto data line pair PDD and /PDD as PAE generation circuit 134 outputs signal /PAE2 at H level at the time of a low frequency operation, that is, when the timing at which signal PAE goes to H level is earlier with respect to signal RDT. As a result, read data is not output from preamplifier 48 onto the data bus pair before signal RDT goes to H level.

Figure 8:
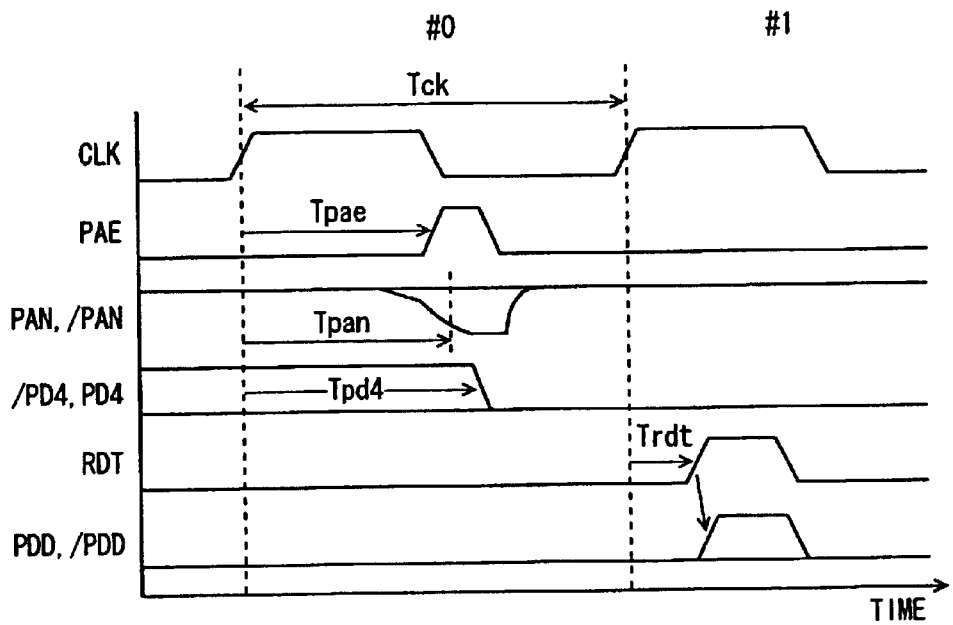
FIG. 8 is a timing chart showing waveforms of principal signals in a preamplifier shown in FIG. 2 when the operation frequency of the semiconductor memory device is low.
Figure 9:
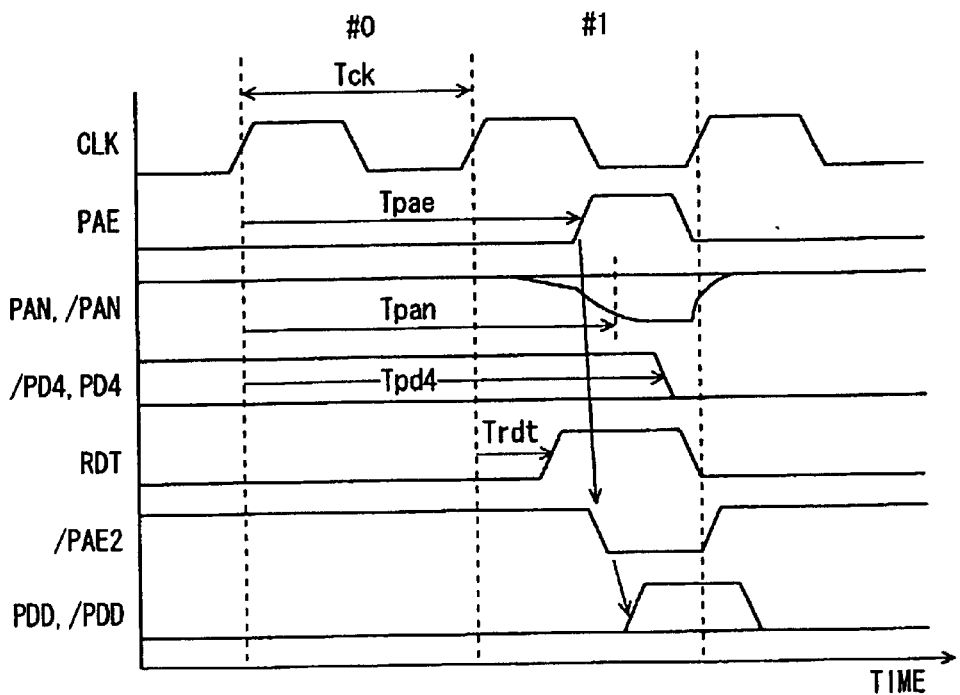
FIG. 9 is a timing chart showing waveforms of principal signals in the preamplifier shown in FIG. 2 when the operation frequency of the semiconductor memory device is high.
Figure 10:
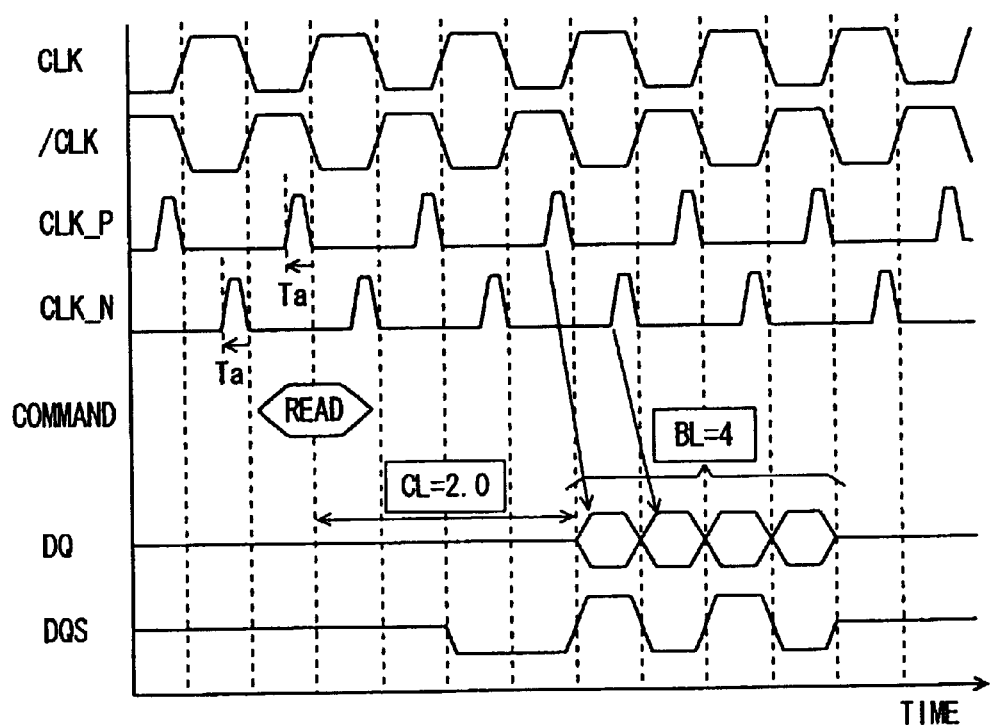
FIG. 10 is a timing chart showing a data output timing in reading data from DDR SDRAM.

FIGS. 8 and 9 are timing charts showing waveforms of principal signals in preamplifier 48. FIG. 8 is a timing chart showing signal waveforms when the operation frequency of semiconductor memory device 10 is low. FIG. 9 is a timing chart showing signal waveforms when the operation frequency of semiconductor memory device 10 is high.

Referring to FIG. 8, signal PAE activating differential amplifier 1406, the signals on differential amp nodes PAN and /PAN and the signals on data line pair /PD4 and PD4 within latency shifter 124 are all based on the rising edge on external clock CLK in clock cycle #0 as the starting point. Time Tpae until signal PAE goes to H level, time Tpan until the signals on differential amp nodes PAN and /PAN are amplified and time Tpd4 until data arrives on data line pair /PD4 and PD4, from the start of clock cycle #0, do not depend on period Tck of external clock CLK.

Signal RDT determining a timing of outputting read data onto data bus pair DB and /DB is based on the rising edge of external clock CLK in clock cycle #1 as a starting point. Time Trdt from the start of clock cycle #1 to H level of signal RDT does not depend on period Tck as well.

When the operation frequency of semiconductor memory device 10 is low, the timing at which signal RDT based on clock cycle #1 as a starting point goes to H level is sufficiently later than the timing at which signal PAE based on clock cycle #0 as a starting point goes to H level and data is transmitted onto data line pair /PD4 and PD4. Furthermore, the period during which signal PAE is at H level does not overlap the period during which signal RDT is at H level and PAE generation circuit 134 does not output signal /PAE2 at L level. Therefore, the signals on data line pair /PD4 and PD4 are output by latency shifter 124 using signal RDT as a trigger onto data line pair PDD and /PDD and read data is output by driver 126 onto data bus pair DB and /DB.

Referring to FIG. 9, when the operation frequency of semiconductor memory device 10 is higher and Tpae>(Tck+Trdt), signal RDT goes to H level before signal PAE goes to H level. Then, after signal RDT goes to H level, at the time signal PAE goes to H level, PAE generation circuit 134 outputs signal /PAE2 at L level. Responsively, inverters 1442 and 1444 in amplify/output circuit 140 are activated and the signals on differential amp nodes PAN and /PAN are directly output onto data line pair PDD and /PDD.

Therefore, in preamplifier 48 of semiconductor memory device 10 in accordance with the present invention, at the time of high frequency with Tck<(Tpae−Trdt), the time period from H level of signal RDT to an actual output of data onto data bus pair DB and /DB is reduced about (Tpd4−Tpan) as compared with the conventional technique.

It is noted that amplifier circuit 122 in this preamplifier 48 outputs read data onto data line pair PD3 and /PD3 also at the time of high frequency with Tck<(Tpae−Trdt), and as in a low frequency operation, data is transmitted to PDD and /PDD through a signal path through latency shifter 124. The reason for such a configuration is that if a signal path through latency shifter 124 and a signal path not through latency shifter 124 are selectively used in the relation between signal RDT and signal PAE, a determination circuit for selecting a faster signal path is required and therefore control becomes complicated.

As described above, in accordance with semiconductor memory device 10 in the present invention, when the operation frequency is high, preamplifier 48 is provided with a signal path through which data is output from amplifier circuit 122 directly to driver 126 by bypassing latency shifter 124, so that it is possible to reduce the time required to actually output data onto data bus pair DB and /DB after signal RDT determining a timing of outputting data onto data bus pair DB and /DB goes to H level, when the operation frequency is high.

Therefore, an operation margin on the following stage in pipeline control is increased, so that the operation frequency for the entire semiconductor memory device 10 can be improved.

Furthermore, a signal path through which data is output from amplifier circuit 122 directly to driver 126 by bypassing latency shifter 124 is provided in parallel with the conventional signal path, so that it is possible to output read data onto the data bus pair via a faster signal path without necessitating a determination circuit for selecting a signal path.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device allowing data input/output in synchronization with a rise and a fall of an external clock, comprising:
    a memory cell array storing data;
    a control circuit producing first and second signals based on an adjacent clock cycle as a starting point;
    a preamplifier amplifying read data read from said memory cell array to be output onto a data bus based on said first and second signals; and
    a data output circuit externally outputting said read data output onto said data bus, wherein
        said preamplifier
        amplifies a signal level of said read data based on said first signal and outputs said read data having the amplified signal level onto said data bus based on said second signal when a timing of receiving said second signal is later than a timing of receiving said first signal, and
        amplifies a signal level of said read data based on said first signal and outputs said read data having the amplified signal level onto said data bus based on the first signal when a timing of receiving said second signal is earlier than a timing of receiving said first signal.

2. The semiconductor memory device according to claim 1, wherein
    said preamplifier includes
        an amplifier circuit receiving said first and second signals to amplify a signal level of said read data based on said first signal,
        a data shift circuit receiving said second signal to shift said read data having the signal level amplified by said amplifier circuit, based on said second signal,
        a driver outputting said read data onto said data bus,
        when a timing of receiving said second signal is later than a timing of receiving said first signal in said amplifier circuit,
        said amplifier circuit outputs said read data having the amplified signal level to said data shift circuit based on said first signal and
        said data shift circuit outputs said read data shifted based on said second signal to said driver, and
        when a timing of receiving said second signal is earlier than a timing of receiving said first signal in said amplifier circuit,
        said amplifier circuit outputs said read data having the amplified signal level to said driver based on said first signal.

3. The semiconductor memory device according to claim 2, wherein
    said preamplifier further includes
        a first data line connecting an input node of said data shift circuit to a first output node of said amplifier circuit and
        a second data line connecting an input node of said driver to an output node of said data shift circuit and to a second output node of said amplifier circuit,
        when a timing of receiving said second signal is later than a timing of receiving said first signal in said amplifier circuit,
        said amplifier circuit outputs said read data having the amplified signal level onto said first data line based on said first signal and
        said data shift circuit outputs said read data shifted based on said second signal onto said second data line, and
        when a timing of receiving said second signal is earlier than a timing of receiving said first signal in said amplifier circuit,
        said amplifier circuit outputs said read data having the amplified signal level onto said second data line based on said first signal.

4. The semiconductor memory device according to claim 2, wherein
    said amplifier circuit
    further outputs said read data having the amplified signal level to said driver based on said second signal when a timing of receiving said second signal is later than a timing of receiving said first signal, and
    further outputs said read data having the amplified signal level to said data shift circuit based on said first signal when a timing of receiving said second signal is earlier than a timing of receiving said first signal.

5. The semiconductor memory device according to claim 4, wherein
    said preamplifier further includes
        a first data line connecting an input node of said data shift circuit to a first output node of said amplifier circuit, and
        a second data line connecting an input node of said driver to an output node of said data shift circuit and to a second output node of said amplifier circuit, when a timing of receiving said second signal is later than a timing of receiving said first signal in said amplifier circuit, said amplifier circuit outputs said read data having the amplified signal level onto said first data line based on said first signal and outputs said read data having the amplified signal level onto said second data line based on said second signal and said data shift circuit outputs said read data shifted based on said second signal onto said second data line, and when a timing of receiving said second signal is earlier than a timing of receiving said first signal in said amplifier circuit, said amplifier circuit outputs said read data having the amplified signal level onto said first and second data lines based on said first signal.

6. The semiconductor memory device according to claim 5, wherein said amplifier circuit includes a differential amplifier taking in and amplifying said read data based on said first signal, a first output circuit latching the read data having the signal level amplified by said differential amplifier and outputting the read data onto said first data line, and a second output circuit outputting the read data having the signal level amplified by said differential amplifier based on said first signal onto said second data line when receiving said second signal.

7. The semiconductor memory device according to claim 6, wherein said amplifier circuit further includes a signal producing circuit producing a third signal when receiving both said first and second signals, and said second output circuit is activated by said third signal produced by said signal producing circuit.

* * * * *